United States Patent
Goebel et al.

[19]

[11] Patent Number: 6,075,265
[45] Date of Patent: Jun. 13, 2000

[54] DRAM CELL ARRANGEMENT AND METHOD FOR ITS FABRICATION

[75] Inventors: Bernd Goebel; Emmerich Bertagnolli, both of Munich, Germany

[73] Assignee: Siemens Aktiengesellschaft, Munich, Germany

[21] Appl. No.: 09/105,235

[22] Filed: Jun. 26, 1998

[30] Foreign Application Priority Data

Jun. 27, 1997 [DE] Germany .......................... 197 27 466

[51] Int. Cl.$^7$ ................................................. H01L 27/108
[52] U.S. Cl. ......................... 257/296; 257/300; 257/302; 257/303; 257/309
[58] Field of Search .................................. 257/296–313, 257/908–909, 907, 905; 438/396–399, 243–253

[56] References Cited

U.S. PATENT DOCUMENTS 5,463,234 10/1995 Toriumi et al. ......................... 257/296

FOREIGN PATENT DOCUMENTS 0 415 530 B1 11/1994 European Pat. Off. .

OTHER PUBLICATIONS

W. H. Krautschneider et al, "Fully Scalable Gain Memory Cell For Future Drams", Microelectronic Engineering 15, 1991, pp. 367–370.
K. Horninger, Integrierte MOS–Schaltungen, Springer Verlag, 1987, pp. 226–229.

Primary Examiner—Minh Loan Tran
Assistant Examiner—Cuong Q Nguyen
Attorney, Agent, or Firm—Hill & Simpson

[57] ABSTRACT

The DRAM cell arrangement has three transistors per memory cell, at least one of which transistors is designed as a vertical transistor. The transistors may be formed on sidewalls (1F1, 1F2, 2F2) of trenches (G1, G2). In order to fabricate contact regions (K) which respectively connect together three source/drain regions (1 S/D1, 3 S/D2, 2 S/D 2) of different transistors, it is advantageous to arrange the trenches (G1, G2) alternately with a larger distance and a smaller distance from one another. Gate electrodes (Ga1, Ga3) of transistors may be formed as parts of writing word lines (WS) or read-out word lines (WA) in the form of spacers on sidewalls (1F1, 1F2) of the trenches (G1). Connections between gate electrodes (Ga2) and source/drain regions (3 S/D1) may be made via conductive structures (L).

8 Claims, 8 Drawing Sheets

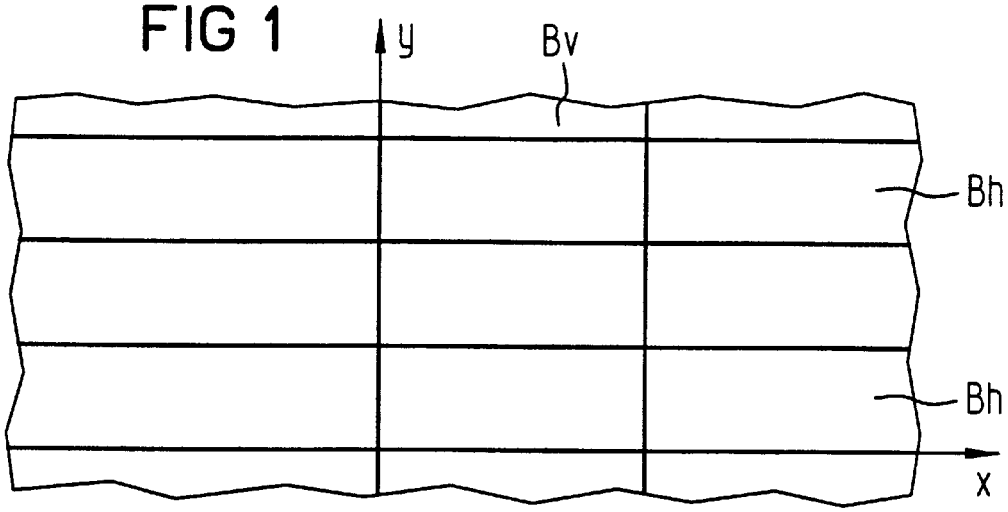
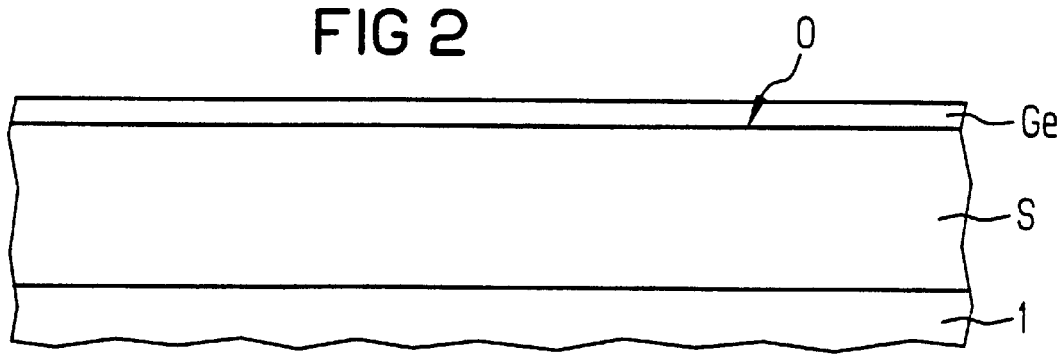
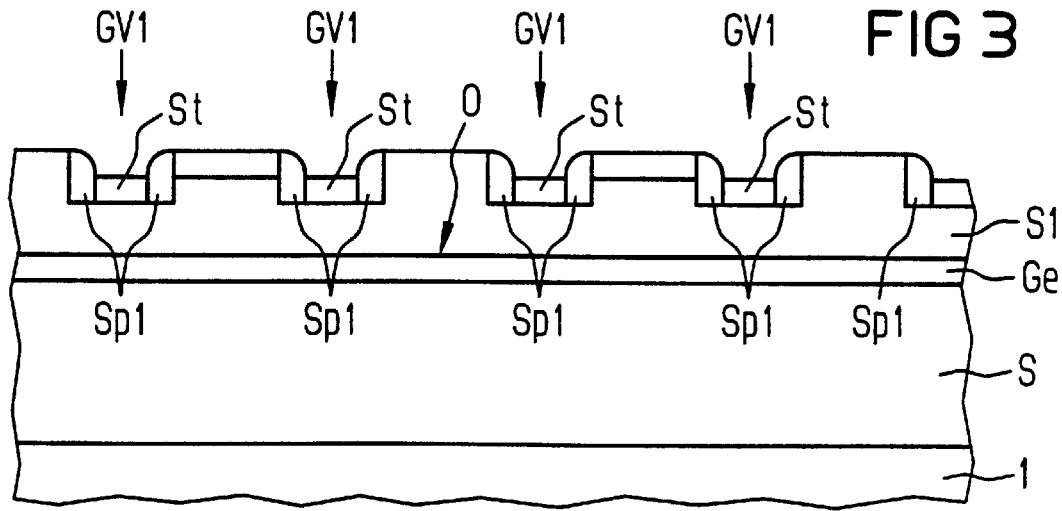

DRAM CELL ARRANGEMENT AND METHOD FOR ITS FABRICATION

BACKGROUND OF THE INVENTION

The present invention relates to a DRAM cell arrangement, that is to say a memory cell arrangement with dynamic random access, in which a memory cell has three transistors.

In DRAM cell arrangements, at the present time use is made almost exclusively of so-called single-transistor memory cells. A single-transistor memory cell has a read-out transistor and a storage capacitor. The information is stored in the storage capacitor in the form of an electric charge, which represents a logic value, 0 or 1. By driving the read-out transistor via a word line, this information can be read out via a bit line. The electric charge stored in the storage capacitor drives the bit line in this case.

Since the storage density increases from memory generation to memory generation, the required area of the single-transistor memory cell must be reduced from generation to generation. This leads to fundamental technological and physical problems. For example, despite a smaller area of the single-transistor memory cell, the storage capacitor must be able to store a minimum amount of electric charge in order to be able to drive the bit line.

This problem is circumvented in an alternative DRAM cell arrangement in which so-called gain cells are used as memory cells. Here, too, the information is stored in the form of an electric charge. However, the electric charge does not have to drive a bit line directly, but rather is stored in a gate electrode of a transistor and serves only to control the latter, for which purpose a very small amount of electric charge is actually sufficient.

A gain cell having three components, namely a first transistor, a second transistor and a diode, is described in Microelectronic Engineering 15 (1991) pages 367–370. The electric charge is stored in a second gate electrode of the second transistor. The electric charge is stored using the first transistor and the diode. For this purpose, the second gate electrode is connected to the diode, the diode is connected to a second source/drain region of the second transistor and to a first source/drain of the first transistor, a first source/drain region of the second transistor is connected to a voltage source and a second source/drain region of the first transistor is connected to a bit line. For the purpose of storage, a first gate electrode of the first transistor is driven via a word line. The amount of electric charge and thus the information stored in the second gate electrode is determined by a voltage on the bit line. The diode is forward-biased in this case. The information is read out by driving the first gate electrode of the first transistor via the word line. The amount of electric charge and thus the information stored in the second gate electrode determines whether or not current flows in the bit line. The diode is reverse-biased in this case.

SUMMARY OF THE INVENTION

The invention is based on the problem of specifying a DRAM cell arrangement whose memory cells take the form of gain cells each having at least three components and which can be fabricated with a particularly high component density. The present invention is also a method for fabricating such a DRAM cell arrangement.

In a DRAM cell arrangement according to the present invention, three components of a memory cell are transistors, at least one of which is designed as a vertical transistor. It is advantageous to design all three transistors of the memory cell as vertical transistors since the area of the memory cell becomes particularly small by doing this.

It lies within the scope of the present invention to form the three transistors on sidewalls of a first trench and of a second trench which run essentially parallel to one another within a substrate. A gate electrode of a second transistor (also referred to as "second gate electrode" below), in which an information item is stored, is connected to a first source/drain region of a third transistor for example via a conductive structure which, for example, above a surface of the substrate, overlaps the first source/drain region of the third transistor and the second gate electrode. The conductive structure may also have elements which are arranged within the second trench and adjoin the second gate electrode. The first source/drain region of the third transistor may also directly adjoin the second gate electrode. The conductive structure is dispensed with in this case.

In order that no currents flow along sidewalls of the first trenches and of the second trenches between neighboring source/drain regions (doped by a first conductivity type) of different transistors, heavily doped channel stop regions can be produced by means of inclined implantation on the sidewalls of the first trenches and of the second trenches between the transistors. The channel stop regions are doped by a second conductivity type opposite the first conductivity type.

It lies within the scope of the present invention to arrange a contact region within the substrate such that it adjoins a bottom of the first trench and a bottom of the second trench, which contact region connects together a first source/drain region of a first transistor, a second source/drain region of the third transistor and a second source/drain region of the second transistor. It is advantageous if the first source/drain region of the first transistor, the second source/drain region of the third transistor and the second source/drain region of the second transistor are parts of the contact region. It is advantageous for the production of the contact region if the distance between the first trench and the second trench is smaller than distances between first trenches and second trenches of different memory cells. As a result, contact regions which are insulated from one another can be produced without masks by means of implantation. The contact region may also be realized as a doped layer or as a layer containing metal, which is connected to the first source/drain region of the first transistor, to the second source/drain region of the third transistor and to the second source/drain region of the second transistor.

If the contact regions are produced by means of implantation, then it is advantageous, prior to the implantation, to provide sidewalls of the first trenches and of the second trenches with spacers by depositing and etching back material, for example $SiO_2$, in order to protect the sidewalls from implantation.

In order to reduce the area of the memory cell, it is advantageous if the distance between the first trench and the second trench is smaller than the minimum structure size F which can be fabricated using the respective technology. For this purpose, during the etching of the first trench and of the second trench, use is made of an insulating layer serving as a mask, which layer has been structured using first spacers and modified by second spacers.

In order to reduce the area of the memory cell, it is advantageous if a second source/drain region of the first transistor is coincident with a second source/drain region of a first transistor of a first neighboring memory cell, and a first source/drain region of the second transistor is coincident with a first source/drain region of a second transistor of a second neighboring memory cell. This means that neighboring memory cells are arranged mirror-symmetrically with respect to one another with regard to an axis running parallel to the first trenches.

It is advantageous to arrange a writing word line and a read-out word line in the form of spacers on the sidewalls of the first trench. Parts of the writing word line can act as gate electrodes of third transistors (also referred to as "third gate electrodes" below) and parts of the read-out word line can act as gate electrodes of first transistors (also referred to as "first gate electrodes" below).

In order to produce the writing word line and the read-out word line, it is advantageous, after the first trench and the second trench have been provided with a gate dielectric, to apply conductive material conformally, to fill the second trench with conductive material and subsequently to etch back the conductive material until the writing word line and the read-out word line are produced in the form of spacers on the sidewalls of the first trench. Parts of the conductive material in the second trenches may be removed with the aid of a mask. A remaining part of the conductive material in the second trench is suitable as the second gate electrode of the second transistor.

It lies within the scope of the present invention, in order to produce a conductive structure which connects the first source/drain region of the third transistor to the second gate electrode of the second transistor, after the production of the second gate electrode of the second transistor, to apply insulating material and structure it using a mask in such a way that part of the first source/drain region of the third transistor is uncovered. The conductive structure may be produced for example by means of selective siliconization. For this purpose, metal is applied over the whole area and then heat-treated, resulting in the formation of metal silicide on the uncovered part of the first source/drain region of the third transistor and on the second gate electrode of the second transistor. Remaining metal is subsequently removed by an etching step. The conductive structure may also be produced by example by applying conductive material which is subsequently etched back or subjected to chemical mechanical polishing.

It lies within the scope of the present invention, in order to improve various properties of the DRAM cell arrangement, to integrate not only the three transistors of the memory cell but also further components, such as e.g. capacitors, in the memory cell.

On account of leakage currents, the information must be written anew to the second gate electrodes at regular intervals. In order to prolong the intervals, it is advantageous to provide each of the memory cells with a capacitor, the first capacitor plate of which is connected to the second gate electrode.

In order to program the memory cell, the first transistor is driven via the read-out word line and the third transistor is driven via the writing word line. Depending on the potential set on a bit line which is connected to a second source/drain region of the first transistor, a charge, which represents the information, is applied to the gate electrode of the second transistor. In order to read out the memory cell, the first transistor is driven via the read-out word line. Depending on the stored charge on the gate electrode of the second transistor, the second transistor is or is not in the on state and current flows or does not flow through the bit line. The first transistor and the second transistor are connected in series as parts of the bit line. The designations "writing word line" and "read-out word line" should be understood such that they are not restrictive.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a detail from a surface of a first substrate. The surface has horizontal regions in strip form which are parallel to an x axis and vertical regions in strip form which are parallel to a y axis;

FIG. 2 shows a cross-section parallel to the x axis and perpendicular to the surface of the first substrate, doped in a layer, after the production of a doped region;

FIG. 3 shows the cross-section from FIG. 2 after the production of first temporary trenches, first spacers and structures in strip form;

DESCRIPTION OF THE PREFERRED EMBODIMENTS

Figure 4:
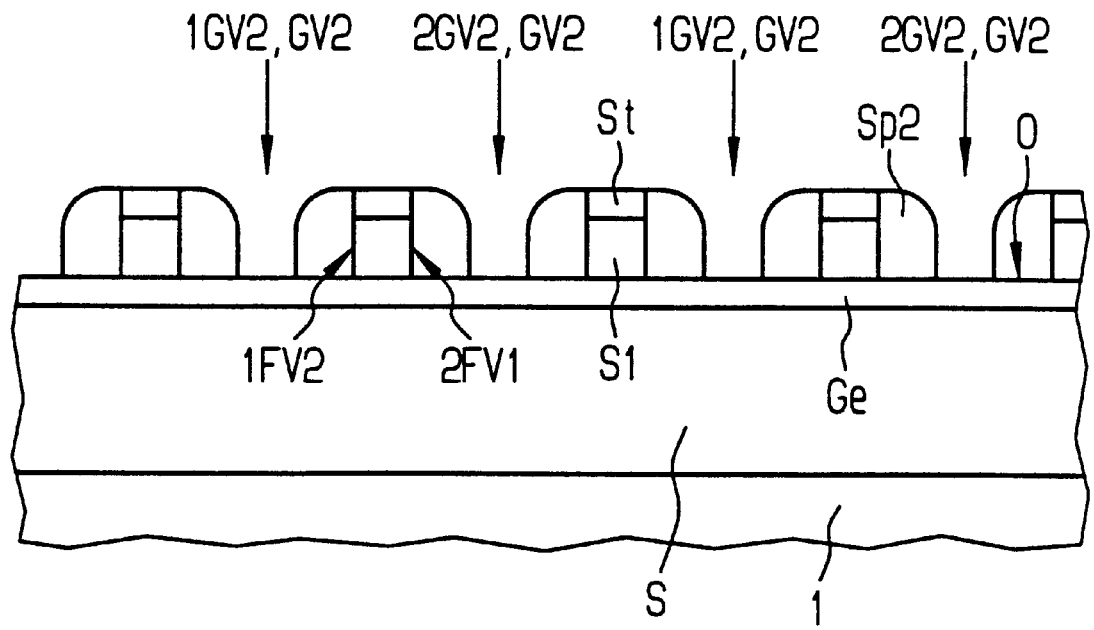
FIG. 4 shows the cross-section from FIG. 3 after the production of second temporary trenches and second spacers.

In accordance with a first exemplary embodiment, a first substrate 1 made of silicon is p-doped in a layer S, which has a thickness of approximately 2 μm and adjoins a surface O of the first substrate 1. The dopant concentration is approximately $10^{17}$ cm$^{-3}$. An x axis x and a y axis y, which is perpendicular to the x axis x, run in the surface O (see FIG. 1). The surface O comprises horizontal regions Bh and vertical regions Bv. The horizontal regions Bh are in strip form, run parallel to the x axis x and have a width of approximately 500 nm. The distance between centre lines of neighboring horizontal regions Bh is approximately 1000 nm. The vertical regions Bv are in strip form, run parallel to the y axis y and have a width of approximately 1000 nm. The distance between centre lines of neighboring vertical regions Bv is approximately 4000 nm. With the aid of a first mask made of photoresist (not illustrated), which does not cover the horizontal regions Bh and the vertical regions Bv, an n-doped region Ge having a depth of approximately 150 nm is produced by means of implantation (see FIG. 2). The dopant concentration of the region Ge is approximately $5 \times 10^{20}$ cm$^{-3}$.

An insulating layer S1 made of SiO$_2$ and having a thickness of approximately 600 nm is deposited on the surface O. With the aid of a second mask made of photoresist and in the form of strips (not illustrated), first temporary trenches GV1 running parallel to one another are produced by means of anisotropic etching (see FIG. 3). CHF$_3$+O$_2$, for example, is suitable for the anisotropic etching of SiO$_2$. A centre line of one of the temporary trenches GV1 is coincident with a centre line of one of the vertical regions Bv. The distance between centre lines of neighboring first temporary trenches GV1 is approximately 1000 nm. The first temporary trenches GV1 have a depth of approximately 300 nm.

In order to produce first spacers Sp1 on sidewalls of the first temporary trenches Gv1, in a TEOS process SiO$_2$ is conformally deposited to a thickness of approximately 125 nm and anisotropically etched back (see FIG. 3).

Polysilicon is subsequently deposited to a thickness of approximately 500 nm. Polysilicon is removed by chemical mechanical polishing until the polysilicon is removed outside the first temporary trenches GV1. The polysilicon is subsequently etched back as far as a depth of approximately 150 nm. This produces polysilicon structures St in strip form. The structures St in strip form have a width which, with approximately 250 nm, is smaller than the minimum structure size F which can be fabricated in the technology used (see FIG. 3).

In order to produce second temporary trenches GV2, parts of the surface O are uncovered by anisotropic etching of SiO$_2$ selectively with respect to silicon. The second temporary trenches GV2 are divided into first second temporary trenches 1GV2 and second second temporary trenches 2GV2 arranged alternately next to one another (see FIG. 4).

Second spacers Sp2 are produced on sidewalls of the second temporary trenches GV2 by deposition of approximately 250 nm of SiO$_2$ in a TEOS process and subsequent anisotropic etching back (see FIG. 4).

Figure 5:
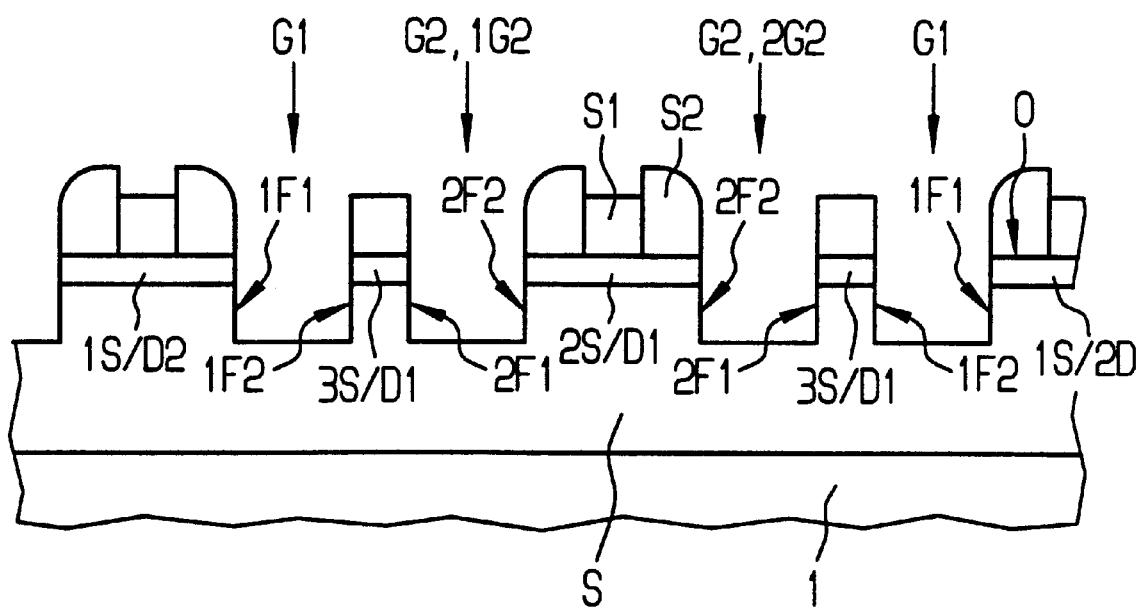
FIG. 5 shows the cross-section from FIG. 4 after the removal of second spacers and the production of first trenches and second trenches. Second source/drain regions of first transistors, first source/drain regions of second transistors and first source/drain regions of third transistors are produced in the process from the doped region.
Figure 11:
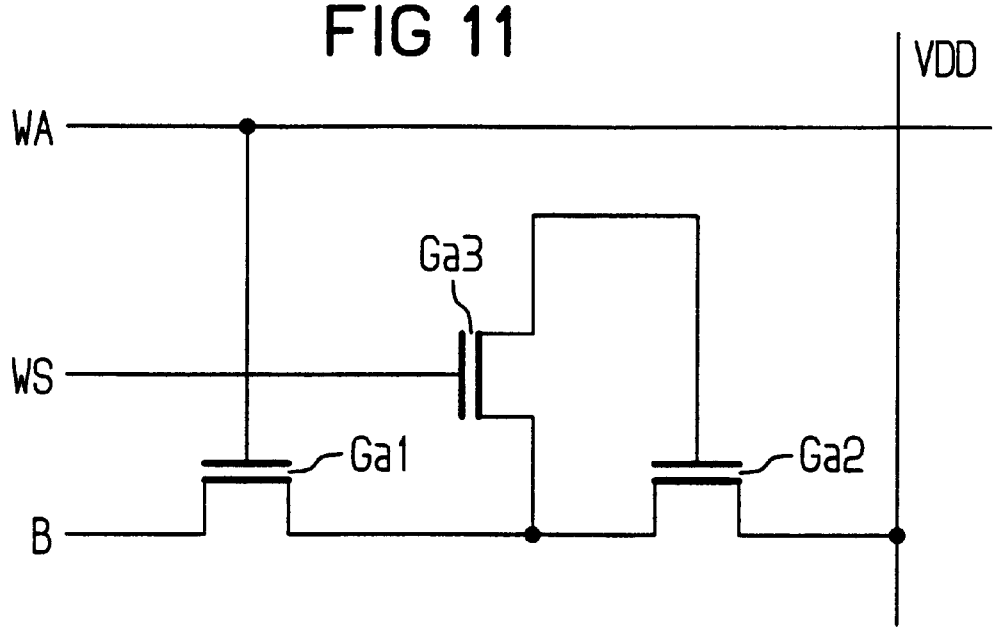
FIG. 11 shows how transistors of a memory cell which has been produced in the first substrate are interconnected.

With the aid of a third mask made of photoresist (not illustrated), an anisotropic etching step is carried out to remove second spacers Sp2 on second sidewalls 1FV2 of the first second temporary trenches 1GV2 and on first sidewalls 2FV1 of the second second temporary trenches 2GV2, which first sidewalls 2FV1 are situated opposite the second sidewalls 1FV2 of the first second temporary trenches 1GV2 (see FIG. 5). Silicon is etched selectively with respect to SiO$_2$ as far as a depth of approximately 600 nm using HBr+NF$_3$+He+O$_2$, for example. First trenches G1 and second trenches G2 are produced as a result of this. The second trenches G2 are divided into first second trenches 1G2 and second second trenches 2G2. The first trenches G1 each neighbor one of the first trenches G1 and one of the first second trenches 1G2 or one of the second second trenches 2G2. The first second trenches 1G2 each neighbor one of the first trenches G1 and one of the second second trenches 2G2 (see FIG. 5). A distance between centre lines of two neighboring first trenches G1 and a distance between centre lines of two neighboring second trenches G2 are greater than a distance between a centre line of a first trench G1 and a center line of a second trench G2 neighboring the first trench G1 and are approximately 750 nm. As a result of this, second source/drain regions of first transistors 1S/D2, which adjoin first sidewalls 1F1 of the first trenches, first source/drain regions of third transistors 3S/D1, which adjoin second sidewalls 1F2 of the first trenches G1 and first sidewalls 2F1 of the second trenches G2, and first source/drain regions 2S/D1 of second transistors, which adjoin second sidewalls 2F2 of the second trenches G2, are produced from the region Ge. Neighboring first source/drain regions 2S/D1 of the second transistors along a second trench G2 are connected to one another and to a VDD voltage terminal VDD (see FIG. 11).

n-doped contact regions K are subsequently produced by implantation with the aid of a fourth mask made of photoresist (not illustrated) and subsequent heat-treatment (see FIG. 6). For this purpose, the fourth mask does not cover the horizontal regions Bh. As a result of the small distance between the first trench G1 and the second trench G2 neighboring the first trench G1, the contact regions K each adjoin a bottom of a first trench G1 and a bottom of a second trench G2. The dopant concentration of the contact regions K is approximately $5 \times 10^{20}$ cm$^{-3}$. Parts of the contact regions K which adjoin bottoms of the first trenches G1 and the first sidewalls 1F1 of the first trenches G1 are suitable as first source/drain regions 1 S/D1 of the first transistors. Parts of the contact regions K which adjoin the bottoms of the first trenches G1 and the second sidewalls 1F2 of the first trenches G1 are suitable as second source/drain regions 3 S/D2 of the third transistors. Parts of the contact regions K which adjoin bottoms of the second trenches G2 and the second sidewalls 2F2 of the second trenches G2 are suitable as second source/drain regions 2 S/D2 of the second transistors (see FIG. 6).

Figure 6:
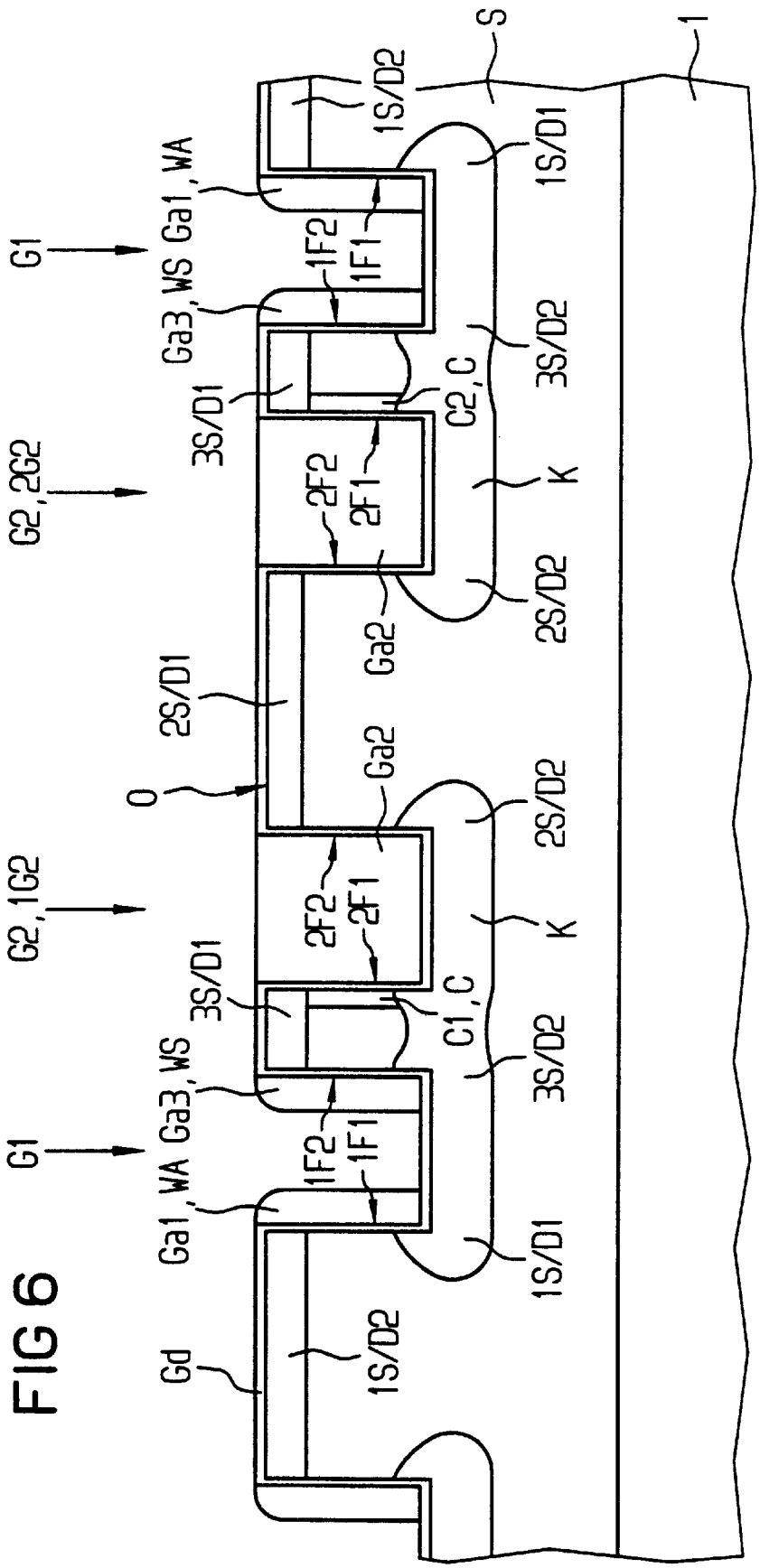
FIG. 6 shows the cross-section from FIG. 5 after the production of contact regions, writing word lines, read-out word lines, channel stop regions, second gate electrodes and second transistors and a gate dielectric. First gate electrodes of first transistors were produced as parts of the read-out word lines and third gate electrodes of third transistors were produced as parts of the writing word lines. First source/drain regions of the first transistors, second source/drain regions of the second transistors and third source/drain regions of the third transistors were produced as parts of the contact regions.

Using a fifth mask made of photoresist (not illustrated), which does not cover regions lying between the horizontal regions Bh and also the first sidewalls 2F1 of the first second trenches 1G2, p-doped first channel stop regions C1 adjoining the first sidewalls 2F1 of the first second trenches 1G2 are produced by means of inclined implantation (see FIG. 6).

Using a sixth mask made of photoresist (not illustrated), which does not cover regions lying between the horizontal regions Bh and also the first sidewalls 2F1 of the second second trenches 2G2, p-doped second channel stop regions C2 adjoining the first sidewalls 2F1 of the second second trenches 2G2 are produced by means of inclined implantation (see FIG. 6). The first channel stop regions C1 and the second channel stop regions C2 together form channel stop regions C (see FIG. 6). The dopant is activated by rapid thermal annealing. The dopant concentration of the channel stop regions C is approximately $10^{19}$ cm$^{-3}$ and is higher than the dopant concentration of the layer S.

Remaining parts of the insulating layer S1 and remaining parts of the second spacers Sp2 are removed in an isotropic etching step (see FIG. 6). A suitable etchant is HF, for example.

A gate dielectric Gd having a thickness of approximately 15 nm is produced by means of thermal oxidation (see FIG. 6).

Dopant polysilicon is subsequently deposited to a thickness of approximately 125 nm. Over this, SiO$_2$ is conformally deposited to a thickness of approximately 400 nm in a TEOS process. SiO$_2$ is removed by chemical mechanical polishing until the SiO$_2$ is removed outside the first trenches G1 and the second trenches G2. With the aid of a seventh mask made of photoresist (not illustrated), which does not cover the second trenches G2, SiO$_2$ is subsequently etched selectively with respect to silicon until SiO$_2$ is removed from the second trenches G2. After the removal of the seventh mask, doped polysilicon is deposited to a thickness of approximately 400 nm, as a result of which the second trenches G2 are filled with polysilicon, and subjected to chemical mechanical polishing until the SiO$_2$ is uncovered in the first trenches G1. SiO$_2$ is subsequently removed from the first trenches G1 by isotropic etching. By etching back polysilicon with high selectivity with respect to SiO$_2$, read-out word lines WA are produced in the form of spacers on the first sidewalls 1F1 of the first trenches G1 and writing word lines WS are produced in the form of spacers on the second sidewalls 1F2 of the first trenches G1 (see FIG. 6) A suitable etchant having high selectivity is C$_2$F$_6$+O$_2$, for example. With the aid of an eighth mask made of photoresist (not illustrated), which does not cover first parts of the second trenches G2 which are situated in the regions lying between the horizontal regions Bh, polysilicon is removed from the first parts of the second trenches G2 by highly selective etching. Remaining parts of polysilicon in the second trenches G2 are suitable as second gate electodes Ga2 of the second transistors (see FIG. 6).

Figure 7:
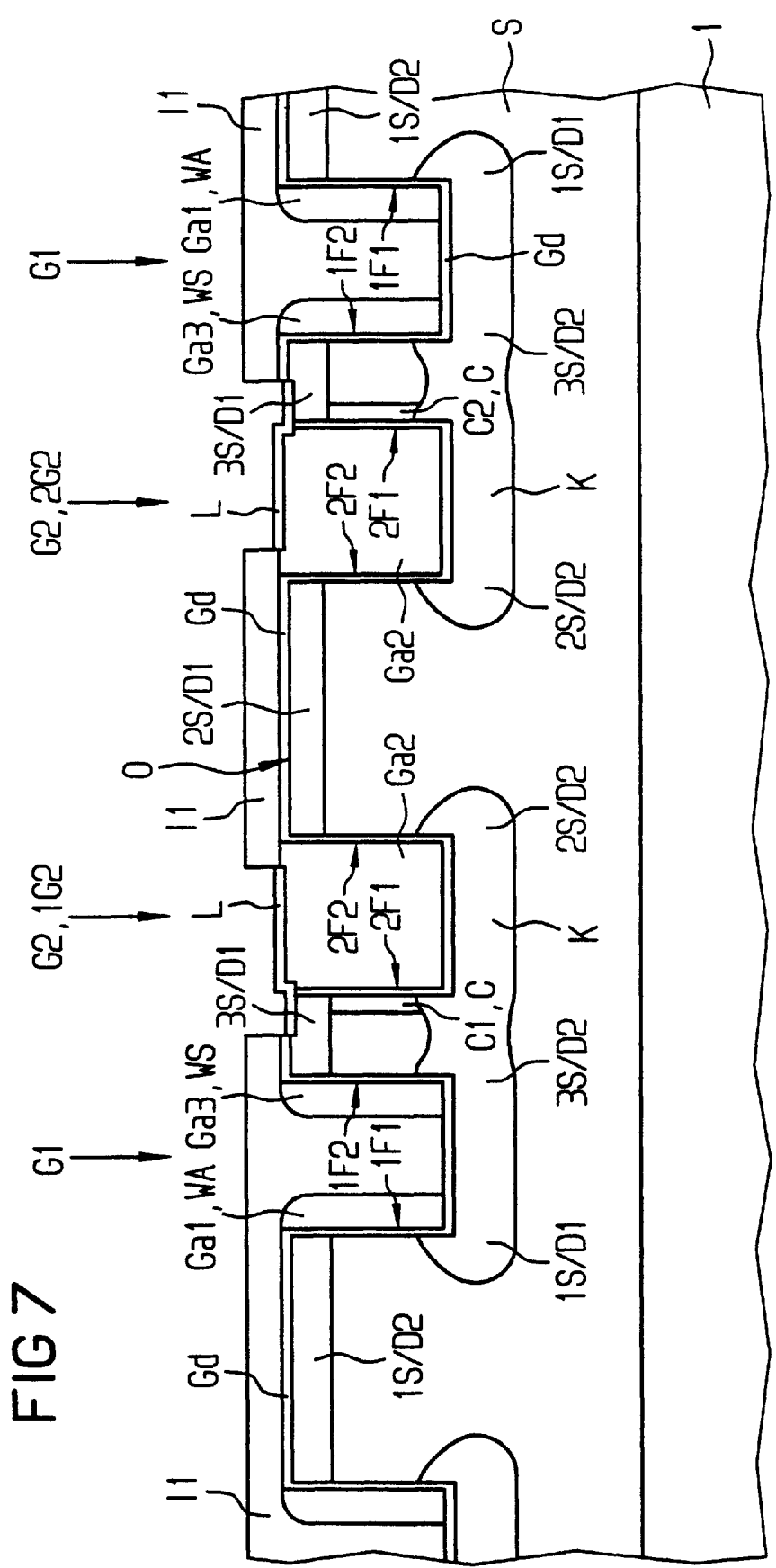
FIG. 7 shows the cross-section from FIG. 6 after the production of first insulating structures and conductive structures.

In a TEOS process, SiO$_2$ is deposited to a thickness of approximately 500 nm and planarized by chemical mechanical polishing. Approximately 400 nm of SiO$_2$ are removed in the process. In order to produce first insulating structures I1, with the aid of a ninth mask made of photoresist (not illustrated), which does not cover the first sidewalls 2F1 of the second trenches G2, SiO$_2$ is etched until parts of the first source/drain regions 3 S/D1 of the third transistors are uncovered (see FIG. 7).

Titanium is subsequently deposited and partially siliconized by heat-treatment. This produces conductive structures L. Remaining titanium is removed by etching using e.g. NH$_3$+H$_2$O$_2$ (see FIG. 7).

Figure 8:
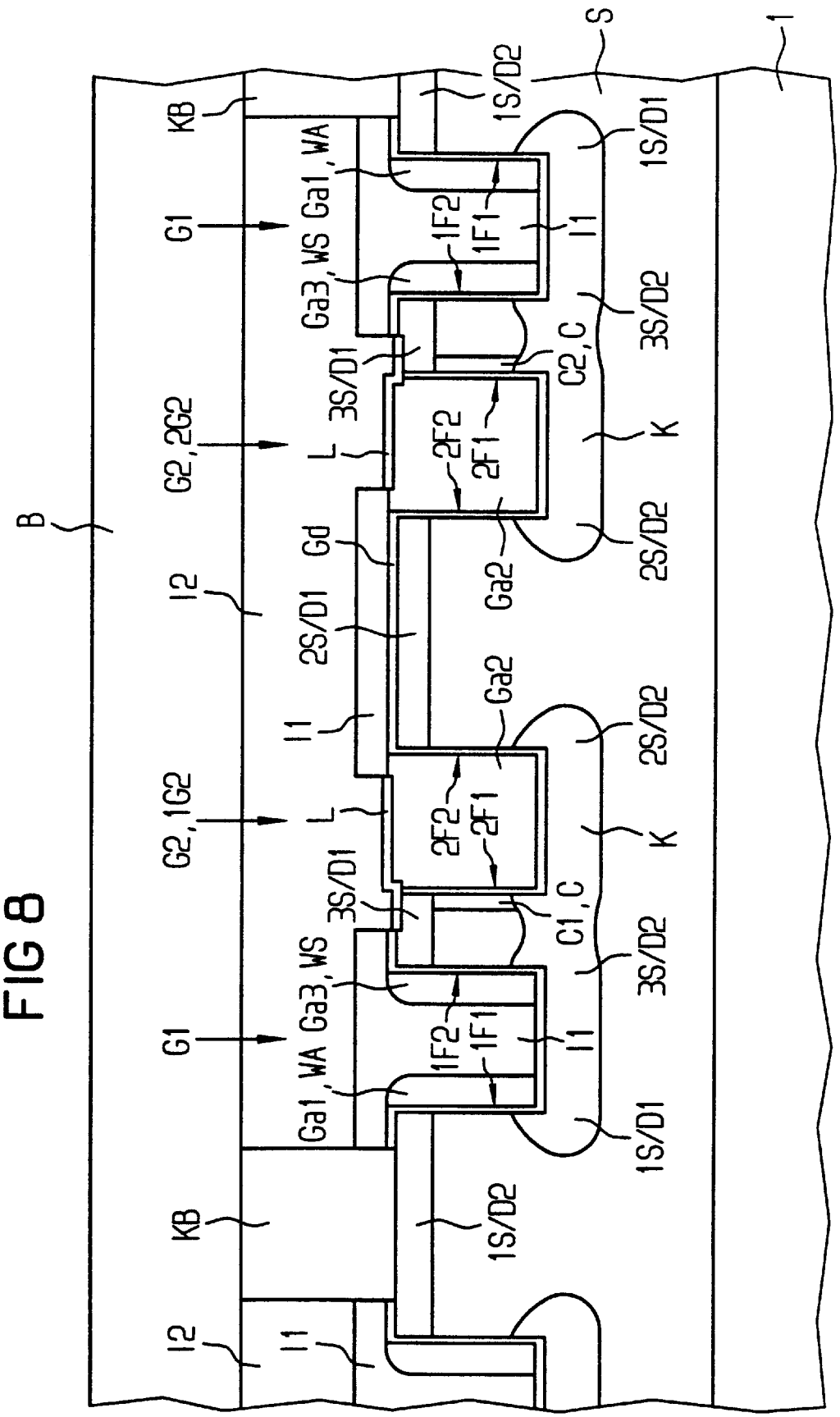
FIG. 8 shows the cross-section from FIG. 7 after the production of second insulating structures, contacts of bit lines and the bit lines.

SiO$_2$ is subsequently deposited to a thickness of 500 nm in order to produce a second insulating structure I2. With the aid of a tenth mask made of photoresist (not illustrated), SiO$_2$ is etched in such a way that parts of the second source/drain regions 1 S/D2 of the first transistors are uncovered. Tungsten is subsequently deposited and etched back, thereby producing contacts KB of bit lines B to be produced. The bit lines B are produced by deposition of AlSiCu to a thickness of, for example, 500 nm and structuring with the aid of an eleventh mask made of photoresist (not illustrated), which covers the horizontal regions Bh (see FIG. 8).

A memory cell comprises one of the first transistors, one of the second transistors and one of the third transistors.

In order to program the memory cell, the first transistor is driven via the read-out word line WA connected to it and the third transistor is driven via the writing word line WS connected to it. Depending on the potential set on the associated bit line B, of which the first transistor and the second transistor are parts, a charge, which represents the information, is applied to the gate electrode of the second transistor Ga2 (see FIG. 11).

In order to read out the memory cell, the first transistor is driven via the read-out word line WA. Depending on the stored charge on the gate electrode of the second transistor Ga2, the second transistor is or is not in the on state and current flows or does not flow through the bit line B (see FIG. 11).

Figure 9:
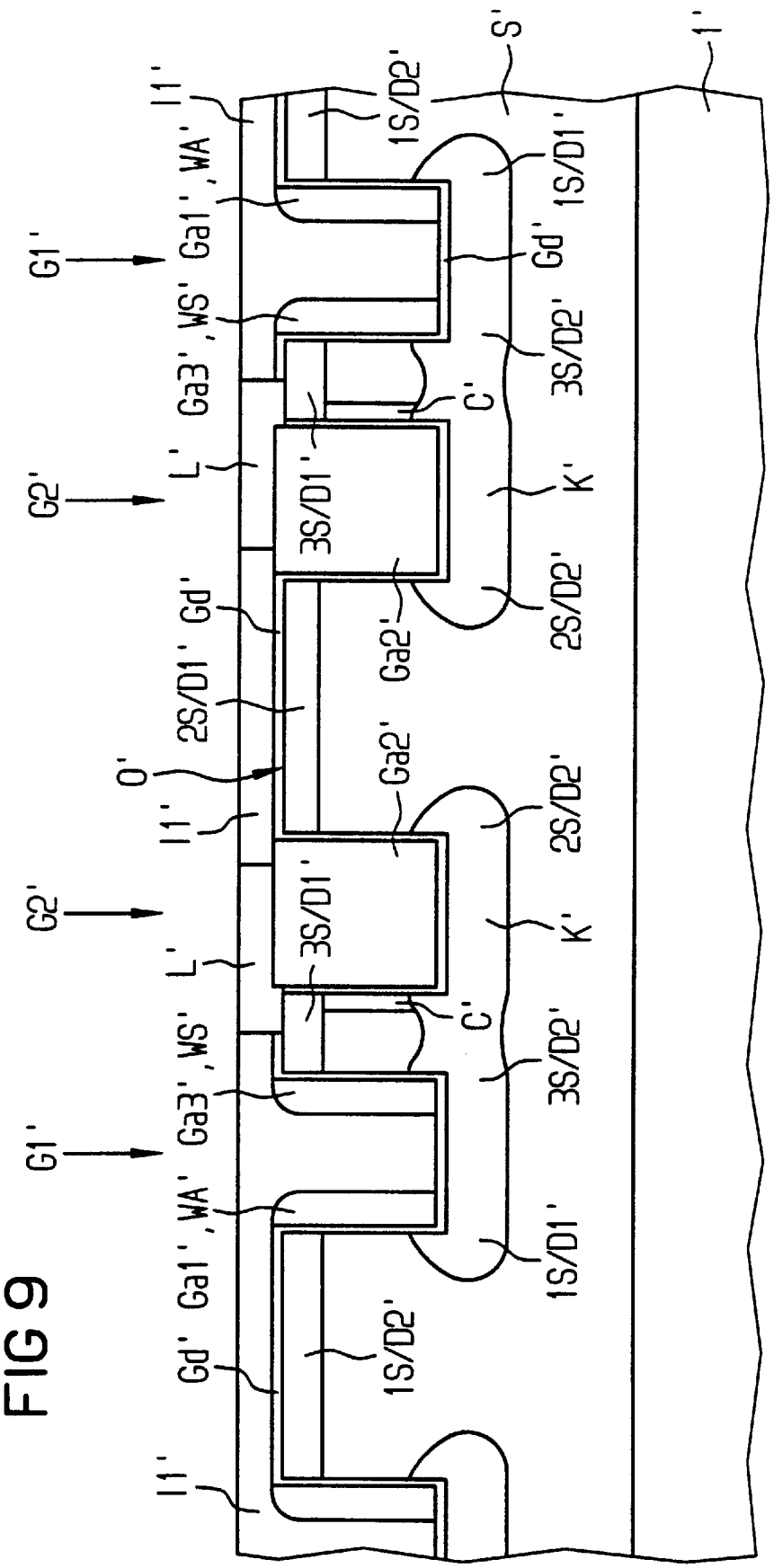
FIG. 9 shows a cross-section perpendicular to a surface of a second substrate, doped in a layer, after the production of a doped region, first trenches, second trenches, second source/drain regions of first transistors, first source/drain regions of second transistors and first source/drain regions of third transistors, contact regions, writing word lines, read-out word lines, channel stop regions, second gate electrodes of second transistors, a gate dielectric, first gate electrodes of first transistors, third gate electrodes of third transistors, first insulating structures and conductive structures.

In a second exemplary embodiment, a second substrate 1' made of silicon is p-doped in a layer S', which has a thickness of approximately 2 μm and adjoins a surface O' of the second substrate 1'. The dopant concentration is approximately $10^{17}$ cm$^{-3}$. In an analogous manner to the first exemplary embodiment, first source/drain regions 2 S/D1' of second transistors, first source/drain regions 3 S/D1' of third transistors, second source/drain regions 1 S/D2' of first transistors, first trenches G1', second trenches G2', a gate dielectric Gd', first gate electrodes Ga1' of the first transistors, second gate electrodes Ga2' of the second transistors, third gate electrodes Ga3' of the third transistors, writing word lines WS', read-out word lines WA', channel stop regions C' and first insulating structures I1' are produced. Tungsten is subsequently deposited to a thickness of approximately 400 nm and structured by chemical mechanical polishing, as a result of which conductive structures L' are produced (see FIG. 9). Second insulating structures I2', contacts KB' of bit lines B' and bit lines B' are subsequently produced in an analogous manner to that in the first exemplary embodiment.

In a third exemplary embodiment, a third substrate 1" made of silicon is p-doped in a layer S", which has a thickness of approximately 2 μm and adjoins a surface O" of the third substrate 1". The dopant concentration is approximately $10^{17}$ cm$^{-3}$. In an analogous manner to the second exemplary embodiment, first source/drain regions 2 S/D1" of second transistors, first source/drain regions 3 S/D1" of third transistors, second source/drain regions 1 S/D2" of first transistors, first trenches G1", second trenches G2", a gate dielectric Gd", first gate electrodes Ga1" of the first transistors, second gate electrodes Ga2" of the second transistors, third gate electrodes Ga3" of the third transistors, writing word lines WS", read-out word lines WA", channel stop regions C", first insulating structures I1" and conductive structures L" are produced.

Figure 10:
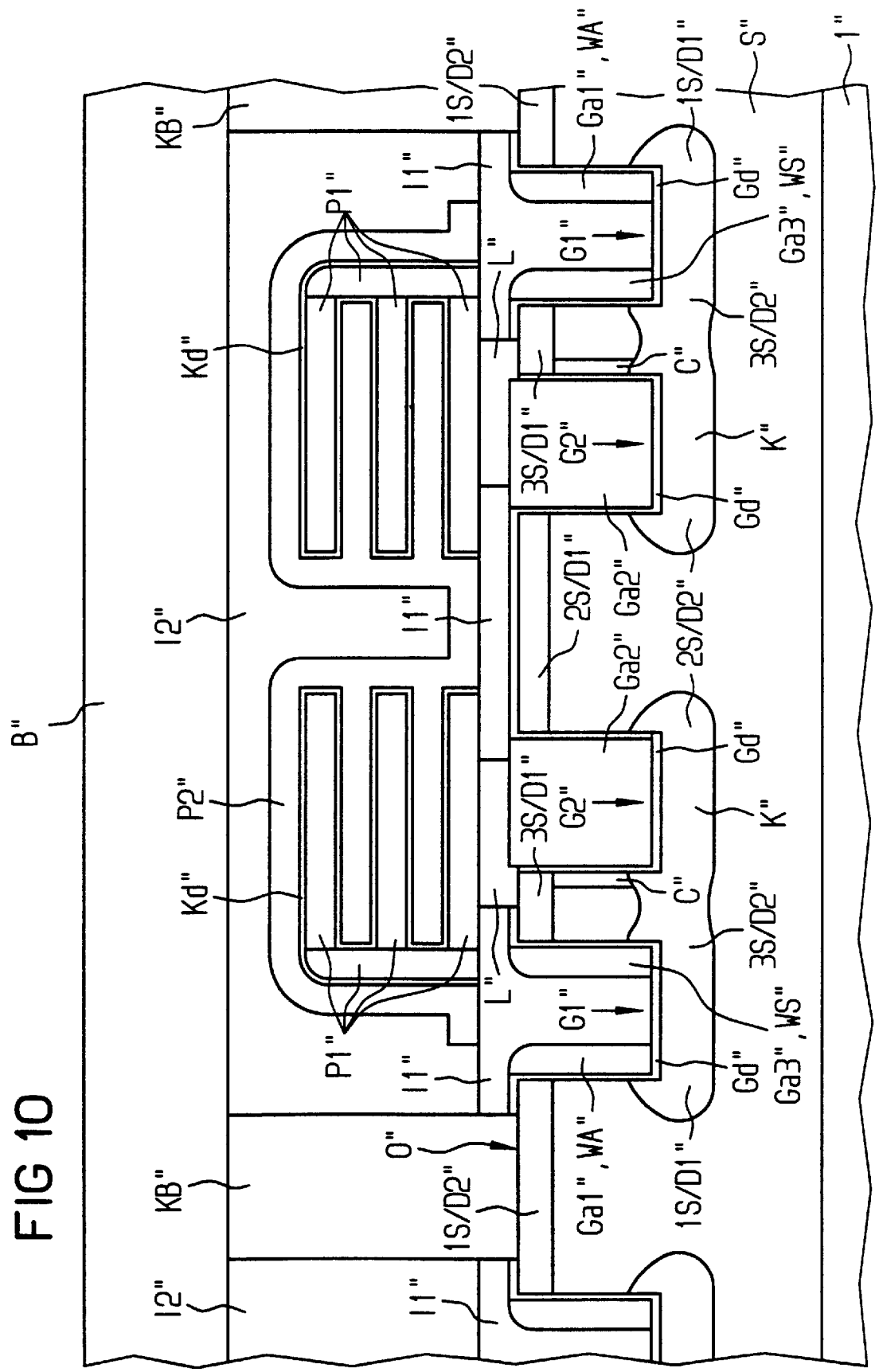
FIG. 10 shows a cross-section perpendicular to a surface of a third substrate, doped in a layer, after the production of a doped region, first trenches, second trenches, second source/drain regions of first transistors, first source/drain regions of second transistors and first source/drain regions of third transistors, contact regions, writing word lines, read-out word lines, channel stop regions, second gate electrodes of second transistors, a gate dielectric, first gate electrodes of first transistors, third gate electrodes of third transistors, first insulating structures, conductive structures, first capacitor plates, capacitor dielectrics, second capacitor plates, second insulating structures, contacts of bit lines and the bit lines.

This is followed by a process for producing stacked capacitors according to the prior art (see, for example, EP 0415530B1). The process comprises producing and structuring a layer sequence above the second insulating structures I2", producing lateral supporting structures Ss" and removing a number of layers of the layer sequence by selective isotropic etching. Supporting structures Ss" with adjoining remaining layers of the layer sequence are in each case suitable as first capacitor plates P1". The process furthermore comprises producing a capacitor dielectric Kd" on surfaces of the first capacitor plates P1" and also depositing and structuring conductive material, such as e.g. doped polysilicon, in order to produce second capacitor plates P2" (see FIG. 10). Second capacitor plates P2" of neighboring capacitors along the second trench G2" are connected to one another and to a ground terminal GND.

After the stacked capacitors have been produced, second insulating structures I2", contacts KB" of bit lines B" and bit lines B" are produced in an analogous manner to the second exemplary embodiment. As in the previous exemplary embodiment, a VDD voltage terminal VDD" is provided. Each two second capacitor plates P2" of neighboring capacitors along the bit line B" are connected to one another.

Figure 12:
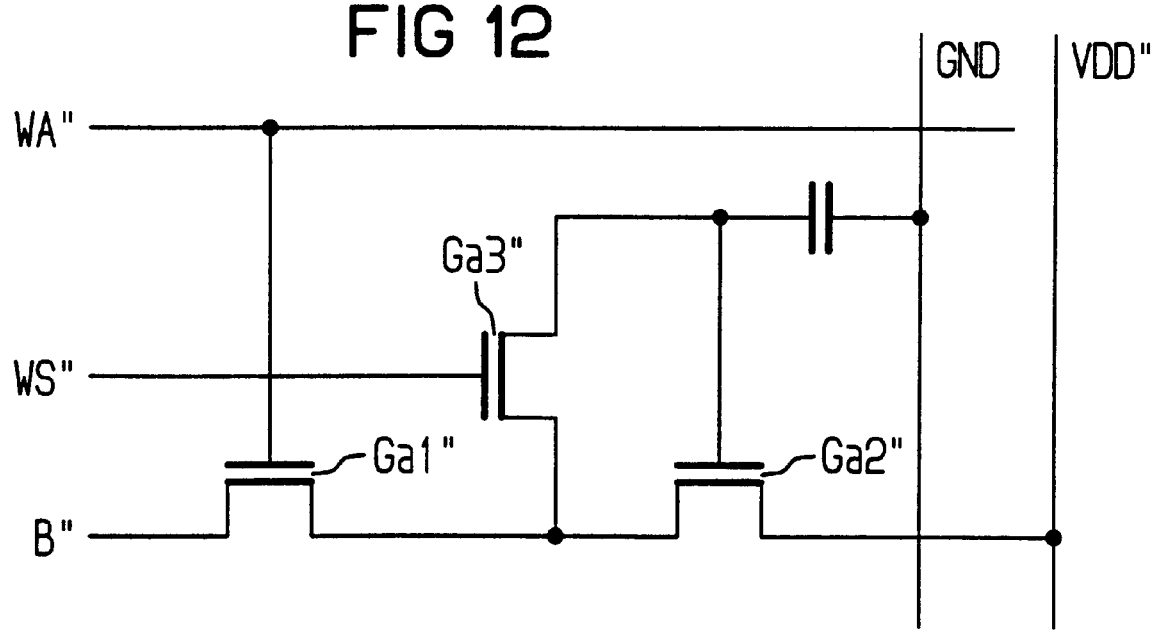
FIG. 12 shows how the transistors and a capacitor of a memory cell which has been produced in the third substrate are interconnected.

A memory cell comprises one of the first transistors, one of the second transistors, one of the third transistors and one of the stacked capacitors. The memory cell is programmed and read out in the same way as in the first exemplary embodiment, the charge representing the information being stored not only in the gate electrode of the second transistor Ga2" but also in the stacked capacitor (see FIG. 12).

There are many conceivable variations of the exemplary embodiments which likewise lie within the scope of the invention. In particular, the dimensions of the described layers, regions and trenches can be adapted to the respective requirements. The same also applies to the dopant concentrations proposed. Structures and layers made of $SiO_2$ can be produced, in particular, by means of thermal oxidation or by a deposition process. Polysilicon may be doped either during or after the deposition. Instead of doped polysilicon, it is also possible to use e.g. metal silicides and/or metals. Instead of removing deposited material, such as $SiO_2$, tungsten, polysilicon, by chemical mechanical polishing, etching back may also be effected. Suitable materials for the capacitor dielectric are primarily dielectrics having high dielectric constants, such as perovskites, for example. The capacitor can also be realized as a plate-type capacitor.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A DRAM cell arrangement, comprising:

memory cells, each of said memory cells respectively formed by a first transistor, a second transistor and a third transistor;

a first gate electrode of the first transistor connected to a read-out word line;

a second source/drain region of the first transistor connected to a bit line;

a first source/drain region of the first transistor connected to a second source/drain region of the third transistor and to a second source/drain region of the second transistor;

a third gate electrode of the third transistor connected to a writing word line;

a first source/drain region of the third transistor connected to a second gate electrode of the second transistor;

a first source/drain region of the second transistor connected to a voltage terminal;

at least one of the first transistor, the second transistor and the third transistor being vertical transistors.

2. The DRAM cell arrangement according to claim 1;

wherein the first transistor, the second transistor and the third transistor are vertical MOS transistors;

wherein the first transistor is arranged on a first sidewall of a first trench situated in a substrate made of semiconductor material, the second transistor is arranged on a second sidewall of a second trench running parallel to the first trench, and the third transistor is arranged on a second sidewall of the first trench;

wherein the first sidewall of the first trench and the second sidewall of the first trench have a gate dielectric;

wherein the read-out word line is arranged as a spacer along the first sidewall of the first trench;

wherein the writing word line is arranged as a spacer along the second sidewall of the first trench;

wherein the first gate electrode of the first transistor is part of the read-out word line;

wherein the third gate electrode of the third transistor is part of the writing word line;

wherein a first sidewall of the second trench and the second sidewall of the second trench have the gate dielectric;

wherein the second gate electrode of the second transistor is arranged on the second sidewall of the second trench;

wherein a contact region adjoins a bottom of the first trench and a bottom of the second trench within the substrate;

wherein the first source/drain region of the first transistor, the second source/drain region of the third transistor and the second source/drain region of the second transistor are parts of the contact region;

wherein contact regions, second gate electrodes of second transistors and conductive structures of neighboring memory cells are insulated from one another;

wherein the second source/drain region of the first transistor adjoins a contact of the bit line and the first sidewall of the first trench;

wherein the first source/drain region of the second transistor adjoins the second sidewall of the second trench;

wherein the first source/drain regions of neighboring second transistors along the second trench are connected to one another;

wherein the bit line runs transversely with respect to the writing word line and adjoins the contact.

3. The DRAM cell arrangement according to claim 2;

wherein a conductive structure connects the second gate electrode of the second transistor to the first source/drain region of the third transistor;

wherein the conductive structure, above a surface of the substrate, adjoins the second gate electrode of the second transistor and the first source/drain region of the third transistor.

4. The DRAM cell arrangement according to claim 2;

wherein the first source/drain region of the first transistor, the second source/drain region of the first transistor, the first source/drain region of the second transistor, the second source/drain region of the second source/drain region of the third transistor and the contact region are doped by a first conductivity type;

wherein the substrate is doped by a second conductivity type opposite to the first conductivity type in a layer adjoining a surface of the substrate;

wherein the layer has a first dopant concentration;

wherein channel stop regions are arranged along the first sidewall of the second trench and between, along the first trench, neighboring first gate electrodes of the first transistors and third gate electrodes of the third transistors on the first sidewall and on the second sidewall of the first trench within the substrate;

wherein the channel stop regions are doped by the second conductivity type and have a second dopant concentration which is higher than the first dopant concentration.

5. The DRAM cell arrangement according to claim 1;

wherein a distance between the first trench and the second trench is smaller than distances between trenches of neighboring memory cells.

6. The DRAM cell arrangement according to claim 2;

wherein neighboring memory cells along the bit line are formed axially symmetrically with regard to an axis which runs parallel to the first trench and within the first source/drain region of the second transistor.

7. The DRAM cell arrangement according to claim 1;

wherein each of the memory cells has a capacitor;

wherein the capacitor has a first capacitor plate, a second capacitor plate and a capacitor dielectric arranged between the first capacitor plate and the second capacitor plate;

wherein the first capacitor plate is connected to the second gate electrode of the second transistor.

8. The DRAM cell arrangement according to claim 7;

wherein the capacitor is a stacked capacitor;

wherein the first capacitor plate adjoins the conductive structure and is arranged above the surface of the substrate;

wherein second capacitor plates of neighboring capacitors along the second trench are connected;

wherein each two second capacitor plates of neighboring capacitors along the bit line are connected.

* * * * *